US007414853B2

(12) United States Patent
Lee

(10) Patent No.: US 7,414,853 B2
(45) Date of Patent: Aug. 19, 2008

(54) INDUSTRIAL OPERATION CONSOLE

(75) Inventor: Chen-Yuan Lee, Taipei Hsien (TW)

(73) Assignee: Aten International Co., Ltd, Taipei Hsien (TW)

( * ) Notice: Subject to any disclaimer, the term of this patent is extended or adjusted under 35 U.S.C. 154(b) by 509 days.

(21) Appl. No.: 11/287,902

(22) Filed: Nov. 28, 2005

(65) Prior Publication Data

US 2007/0121302 A1 May 31, 2007

(51) Int. Cl.
*H05K 5/00* (2006.01)
(52) U.S. Cl. ..................................... 361/726
(58) Field of Classification Search .............. 361/726
See application file for complete search history.

(56) References Cited

U.S. PATENT DOCUMENTS

| | | | | | |
|---|---|---|---|---|---|
| 5,388,032 | A | * | 2/1995 | Gill et al. ......................... | 700/17 |
| 6,201,690 | B1 | * | 3/2001 | Moore et al. ..................... | 361/683 |
| 6,353,532 | B1 | * | 3/2002 | Landrum et al. ................. | 361/683 |
| 6,520,346 | B1 | * | 2/2003 | Liu ................................... | 211/26 |
| 6,563,700 | B1 | * | 5/2003 | Waller et al. ..................... | 361/683 |
| 6,726,164 | B1 | * | 4/2004 | Baiza et al. ...................... | 248/222.12 |
| 6,807,054 | B1 | * | 10/2004 | Waller et al. .................... | 361/683 |
| 6,827,409 | B2 | * | 12/2004 | Michael ............................ | 312/223.3 |
| 6,856,505 | B1 | * | 2/2005 | Venegas et al. ................. | 361/683 |
| 6,945,412 | B2 | * | 9/2005 | Felcman et al. ................. | 211/26 |
| 6,956,735 | B2 | * | 10/2005 | Lee et al. ......................... | 361/683 |
| 7,019,963 | B2 | * | 3/2006 | Lee et al. ......................... | 361/683 |
| 7,256,986 | B2 | * | 8/2007 | Williams et al. ................ | 361/683 |
| 2005/0168926 | A1 | * | 8/2005 | Lee et al. ......................... | 361/683 |
| 2006/0232917 | A1 | * | 10/2006 | Wu et al. .......................... | 361/681 |

* cited by examiner

*Primary Examiner*—Lisa Lea-Edmonds
(74) *Attorney, Agent, or Firm*—Thomas, Kayden, Horstemeyer & Risley

(57) ABSTRACT

A KVM operation console includes a lower body and an upper body. The lower body and the upper body are assembled into and can be separately slid from an industrial console. A lock mechanism is installed in a bottom cover of the upper body. An L-shaped arm and is pivotally connected with the bottom cover. A lock shaft and a handle are respectively pivotally connected with two ends of the L-shaped arm. The handle is moved to retract the lock shaft from or extend the lock shaft into an opening of the bottom cover by a torque of the L-shaped arm. The extended lock shaft is inserted into a hole of the industrial console so as to secure the upper body. The upper body blocks a holder of the lower body to prevent the lower body from sliding out of the industrial console.

9 Claims, 5 Drawing Sheets

INDUSTRIAL OPERATION CONSOLE

BACKGROUND

1. Field of Invention

The present invention relates to a modularized industrial console, especially to a modularized industrial console providing keyboard, video and mouse (KVM) interfaces for the user.

2. Description of Related Art

As illustrated in FIG. 1, the prior art industrial console includes an operation console 100. Two sliding grooves 108 are assembled in an industrial rack (not shown), within which the operation console 100 is assembled. The operation console 100 can be pulled out from the industrial rack during operation.

The operation console 100 has a lower body 102 and an upper body 104. The upper body 104 is pivotally connected with the lower body 102 by hinges 106a and 106b; thus the upper body 104 can swivel to an upright position during operation. Otherwise, an idle or shut-off operation console 100 is kept within the two sliding grooves 108 with its upper body 104 laid against its lower body 102.

The industrial rack is usually installed in a factory, where vibrations may rattle the operation console 100. If the operation console 100 is not properly secured within the two sliding grooves 108, the upper body 104 or the lower body 102 might be damaged due to vibrations; i.e. the upper body 104 may repeatedly hit the lower body 102 to cause a cracked housing.

SUMMARY

It is therefore an objective of the present invention to provide an operation console, which can be properly secured, when it is idle or shut off.

In accordance with the foregoing and other objectives of the present invention, an operation console with a lock mechanism is provided. The operation console includes a lower body and an upper body. The lower body and the upper body are assembled into and separately slid from an industrial console. A lock mechanism is installed in a bottom cover of the upper body. An L-shaped arm is pivotally connected with the bottom cover. A lock shaft is pivotally connected with one end of the L-shaped arm. A handle is pivotally connected with other end of the L-shaped arm. The handle is moved to retract the lock shaft from or extend the lock shaft into an opening of the bottom cover by a torque of the L-shaped arm. The lock shaft extended from the opening is inserted into a hole of the industrial console so as to secure the upper body. The upper body blocks a holder of the lower body to prevent the lower body from sliding out of the industrial console.

In conclusion, a lock mechanism of the present invention is installed to properly secure an idle or shut-off KVM operation console so as to prevent it from vibration damage.

It is to be understood that both the foregoing general description and the following detailed description are by examples and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
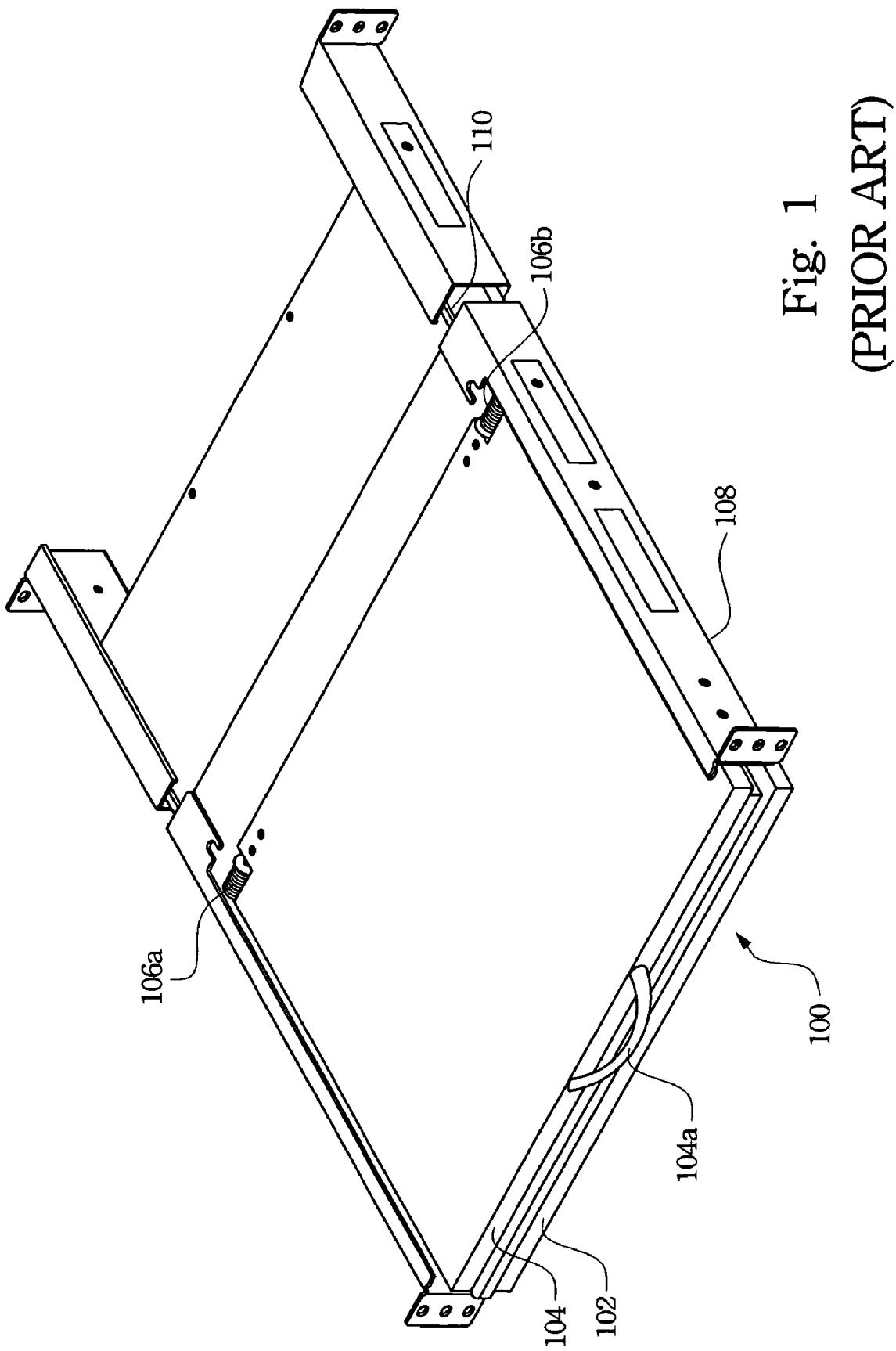
FIG. 1 illustrates a perspective view of a prior art industrial console.

Reference will now be made in detail to the present preferred embodiments of the invention, examples of which are illustrated in the accompanying drawings. Wherever possible, the same reference numbers are used in the drawings and the description to refer to the same or like parts.

Figure 2:
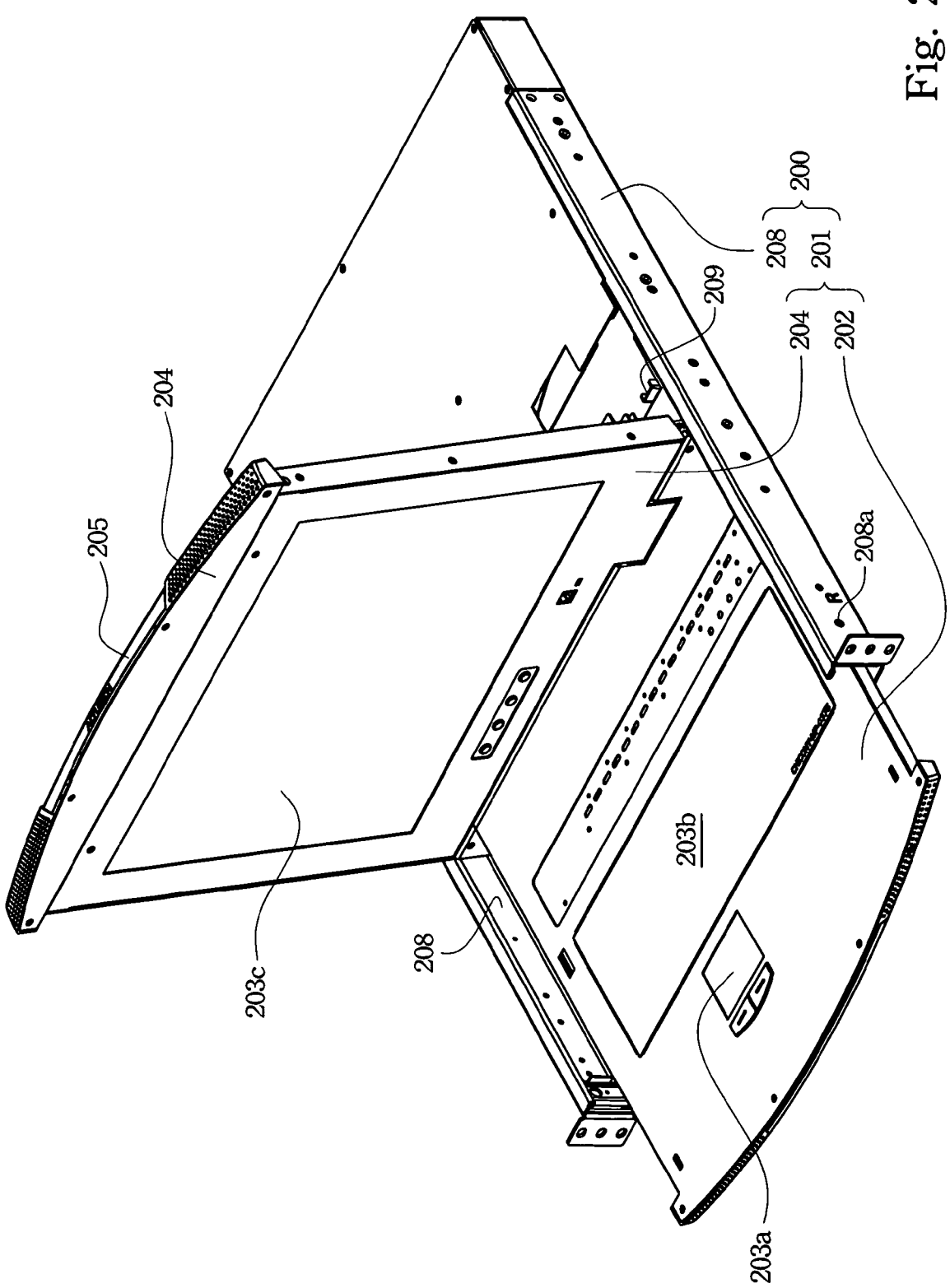
FIG. 2 illustrates a perspective view of an industrial console according to one preferred embodiment of this invention.

FIG. 2 illustrates a perspective view of an industrial console according to one preferred embodiment of this invention. An industrial console 200 is assembled in an industrial rack (not shown), i.e. a fixing frame 208 (part of the industrial console 200) is assembled into an industrial rack. A KVM (keyboard, video, mouse) operation console 201 is assembled into the fixing frame 208. The KVM operation console 201 includes a lower body 202 and an upper body 204. The lower body 202 and the upper body 204 can be separately slid from the industrial console 200. The lower body 202 includes a touch pad 203a and a keyboard 203b as an interface for operation. The upper body 204 also includes an LCD monitor 203c as an interface for operation.

The industrial rack is usually installed in a factory, where vibrations may rattle the KVM operation console 201. An idle or shut-off KVM operation console 201 is kept within the fixing frame 208 with its upper body 204 laid against its lower body 202. The upper body 204 is properly secured within the fixing frame 208 and can block a holder 209 so as to prevent the lower body 202 from sliding out of the fixing frame 208. (The method by which the upper body 204 is properly secured within the fixing frame 208 is described in the next paragraph.) Thus, vibrations do not damage an idle or shut-off KVM operation console 201.

Figure 3A:
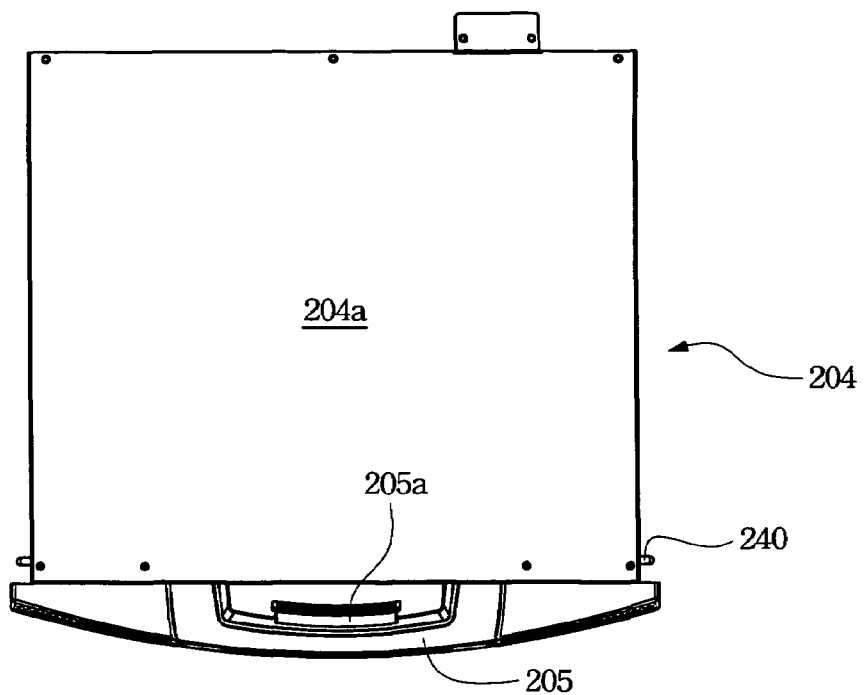
FIG. 3A illustrates a top view of an industrial console in a locked status according to one preferred embodiment of this invention.

As illustrated in FIG. 3A, the KVM operation console 201 has a protruded lock shaft 240. The protruded lock shaft 240 inserts into a hole 208a (as illustrated in FIG. 2) of the fixing frame 208. The upper body 204 is properly secured to the fixing frame 208 when the protruded lock shaft 240 inserts into the hole 208a.

Figure 3B:
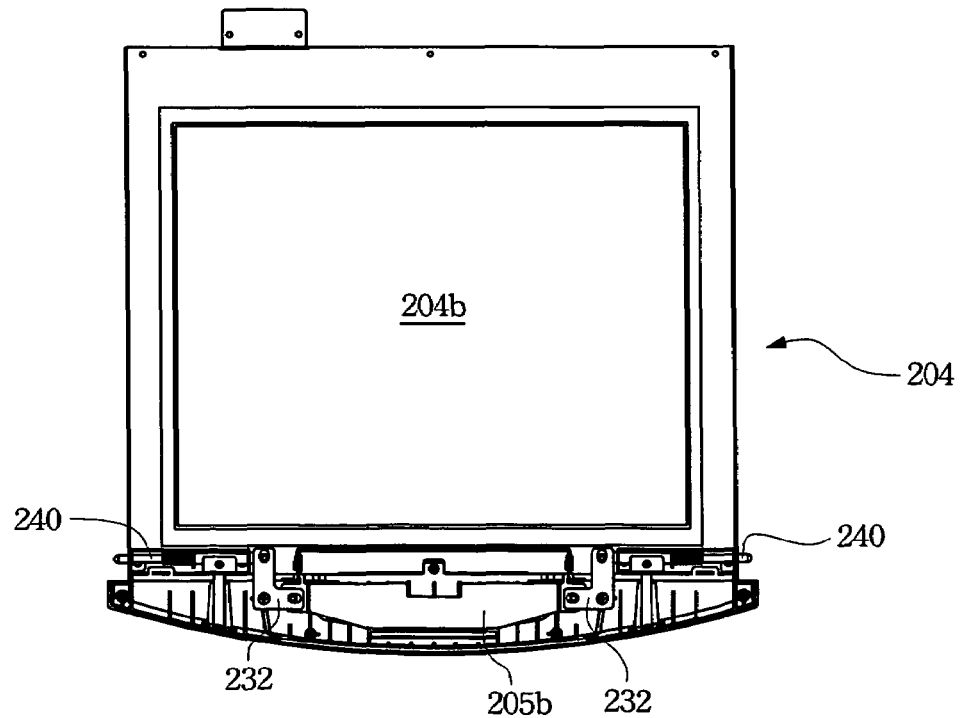
FIG. 3B illustrates a top view of an industrial console with its top cover removed while in a locked status according to one preferred embodiment of this invention.

As illustrated in FIG. 3B, a top cover 204b is removed from the upper body 204 and the lock mechanism is revealed. The lock mechanism consists mainly of a handle extension 205b, an L-shaped arm 232 and the lock shaft 240. The L-shaped arm 232 is pivotally connected with a bottom cover 204b. The handle extension 205b and the lock shaft 240 are respectively pivotally connected with two ends of the L-shaped arm 232. The handle extension 205b is part of a handle 205 (as illustrated in FIG. 3A). That is, the handle extension 205b is moved at the same time that an unlock latch 205a (as illustrated in FIG. 3A) is moved by a user. The handle extension 205b is thus moved to generate a torque to rotate the L-shaped arm 232 and to further control the action of the lock shaft 240.

Figure 4A:
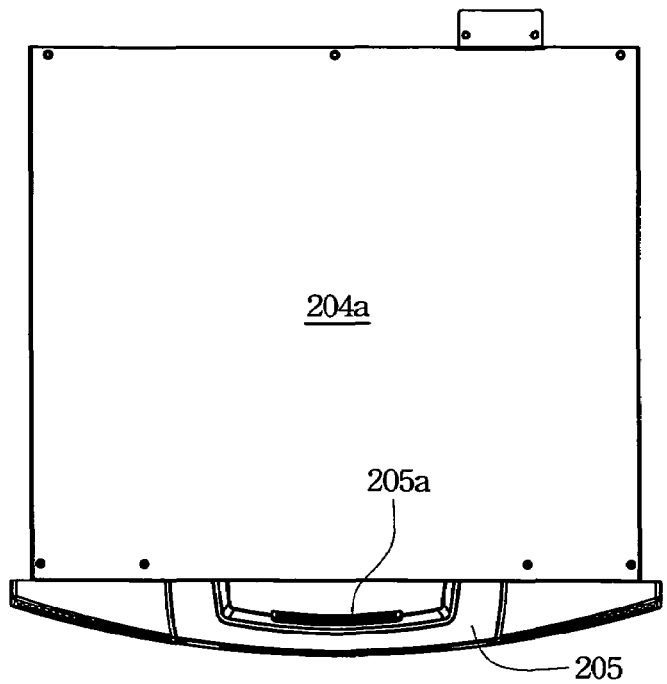
FIG. 4A illustrates a top view of an industrial console in an unlocked status according to one preferred embodiment of this invention.

As illustrated in FIG. 4A, an unlock latch 205a (part of the handle 205) is pushed so as to keep the lock shaft 240 within the upper body 204. The upper body 204 is then freely slid from the fixing frame 208.

Figure 4B:
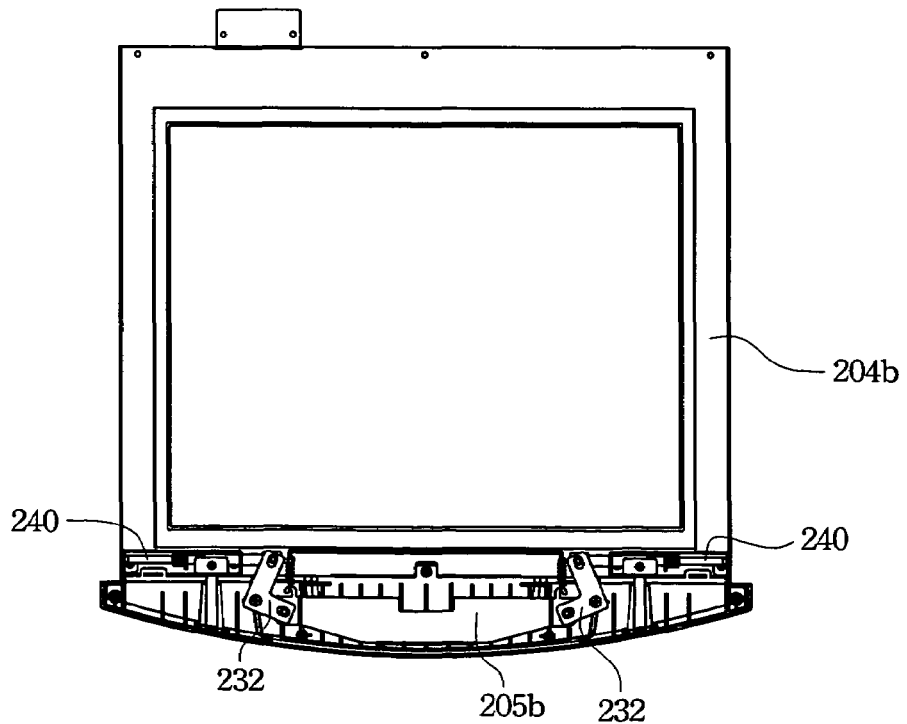
FIG. 4B illustrates a top view of an industrial console with its top cover removed while in an unlocked status according to one preferred embodiment of this invention.

As illustrated in FIG. 4B, a handle extension 205b (part of the handle 205) is moved as soon as the unlock latch 205a (as illustrated in FIG. 4A) is pushed. The handle extension 205b generates a torque to rotate the L-shaped arm 232, such that the rotated L-shaped arm 232 inwardly pulls the lock shaft 240 into the upper body 204. The upper body 204 is then freely slid from the fixing frame 208.

Figure 5:
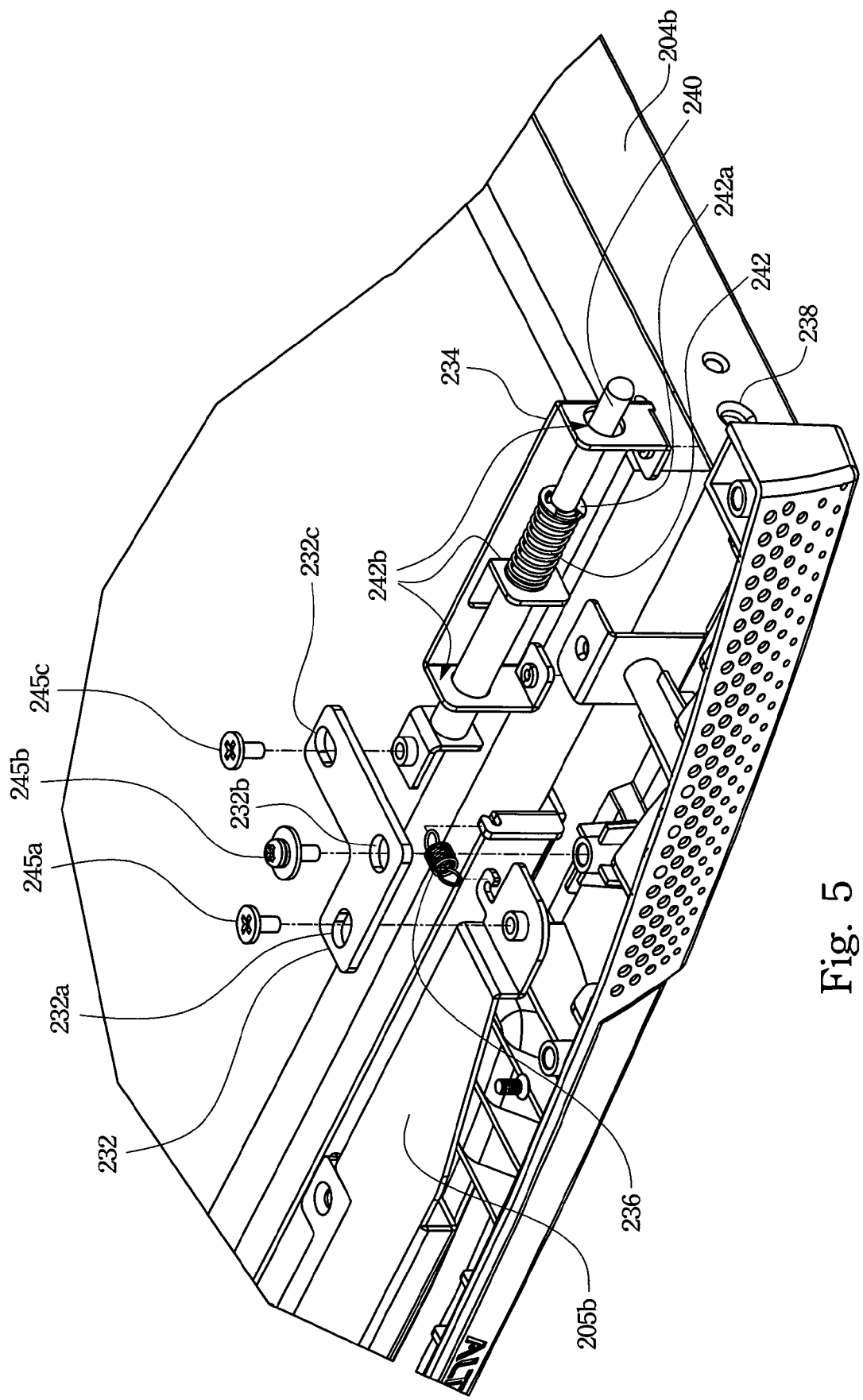
FIG. 5 illustrates an exploded view of a lock mechanism according to one preferred embodiment of this invention.

FIG. 5 illustrates an exploded view of a lock mechanism according to one preferred embodiment of this invention. The housing of the upper body 204 includes a top cover 204a (illustrated in FIG. 4A) and a bottom cover 204b. The lock mechanism is installed within the housing of the upper body 204, i.e. on the bottom cover 204b. The lock mechanism consists mainly of the handle extension 205b, the L-shaped arm 232 and the lock shaft 240. The L-shaped arm 232 is pivotally connected with the bottom cover 204b by bolt 245b fastened to the bottom cover 204b through a hole 232b. One end of the L-shaped arm 232 is pivotally connected with the handle extension 205b by bolt 245a fastened to the handle extension 205b through a hole 232a. The other end of the L-shaped arm 232 is pivotally connected with the lock shaft 240 by a bolt 245c fastened to the lock shaft 240 through a hole 232c. Two ends of a spring 236 are respectively attached to the handle extension 205b and the bottom cover 204b. A support portion 234, mounted in the bottom cover 204b, has three openings 242b to accommodate the lock shaft 240. An E-clip 242a is mounted on the lock shaft 240 to hold a spring 242 between one of three openings 242b and the E-clip 242a itself. Both springs 236 and 242 provide forces to maintain the lock shaft 240 protruded from an opening 238.

According to preferred embodiments of present invention, a lock mechanism is installed to properly secure an idle or shut-off KVM operation console so as to prevent it from vibration damage.

Although the present invention has been described in considerable detail with reference to certain preferred embodiments thereof, other embodiments are possible. For example, the lock mechanism may be installed in a lower body of an industrial console. Therefore, the spirit and scope of the appended claims should not be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An operation console, comprising:
a lower body, having a holder;
an upper body, disposed above said lower body, wherein said lower body and said upper body are assembled into and separately slid from an industrial console; and
a lock mechanism installed in said upper body, wherein said lock mechanism comprises:
a housing, having a first opening;
an arm, pivotally connected with said housing;
a lock shaft, pivotally connected with one end of said arm; and
a handle, pivotally connected with an other end of said arm, wherein said handle is moved to retract said lock shaft from or extend said lock shaft into said first opening by a torque of said arm, said lock shaft extended from said first opening is inserted into a hole of the industrial console so as to secure said upper body, and said upper body blocks said holder to prevent said lower body from sliding out of the industrial console.

2. The operation console of claim 1, wherein said lower body includes a keyboard and a touch pad.

3. The operation console of claim 1, wherein said upper body includes an LCD panel.

4. The operation console of claim 1, wherein said lock mechanism further comprises a spring, two ends of said spring being respectively connected with said housing and said handle.

5. The operation console of claim 1, wherein said lock mechanism further comprises:
a support portion mounted in said housing, said support portion having three second openings to accommodate said lock shaft;
an E-clip, mounted on said lock shaft; and
a spring installed between said E-clip and one of said three second openings to maintain said lock shaft extended from said first opening.

6. A lock mechanism installed in a KVM operation console, wherein said lock mechanism comprises:
a housing, having a first opening;
an L-shaped arm, pivotally connected with said housing;
a lock shaft, pivotally connected with one end of said L-shaped arm; and
a handle, pivotally connected with an other end of said L-shaped arm, wherein said handle is moved to retract said lock shaft from or extend said lock shaft into said first opening by a torque of said L-shaped arm, said lock shaft extended into said first opening is inserted into a hole of an industrial console so as to secure the KVM operation console.

7. The lock mechanism of claim 6, further comprising a first spring, wherein two ends of said spring are respectively connected with said housing and said handle.

8. The lock mechanism of claim 7, further comprising:
a support portion mounted in said housing, said support portion having three second openings to accommodate said lock shaft;
an E-clip, mounted on said lock shaft; and
a second spring installed between said E-clip and one of said three second openings to maintain said lock shaft extended from said first opening.

9. The lock mechanism of claim 6, further comprising:
a support portion mounted in said housing, said support portion having three second openings to accommodate said lock shaft;
an E-clip, mounted on said lock shaft; and
a spring installed between said E-clip and one of said three second openings to maintain said lock shaft extended from said first opening.

* * * * *